(12) United States Patent
Long et al.

(10) Patent No.: US 12,165,841 B2
(45) Date of Patent: Dec. 10, 2024

(54) DUAL-FREQUENCY, DIRECT-DRIVE INDUCTIVELY COUPLED PLASMA SOURCE

(71) Applicant: Lam Research Corporation, Fremont, CA (US)

(72) Inventors: Maolin Long, Santa Clara, CA (US); Yuhou Wang, Fremont, CA (US); Alexander Miller Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 511 days.

(21) Appl. No.: 17/606,686

(22) PCT Filed: Apr. 24, 2020

(86) PCT No.: PCT/US2020/029877
§ 371 (c)(1),
(2) Date: Oct. 26, 2021

(87) PCT Pub. No.: WO2020/223127
PCT Pub. Date: Nov. 5, 2020

(65) Prior Publication Data
US 2022/0199365 A1 Jun. 23, 2022

Related U.S. Application Data

(60) Provisional application No. 62/840,554, filed on Apr. 30, 2019.

(51) Int. Cl.
H01J 37/32 (2006.01)

(52) U.S. Cl.
CPC ..... *H01J 37/3211* (2013.01); *H01J 37/32165* (2013.01); *H01J 37/32174* (2013.01); *H01J 37/3299* (2013.01); *H01J 2237/334* (2013.01)

(58) Field of Classification Search
None
See application file for complete search history.

(56) References Cited

U.S. PATENT DOCUMENTS

| | | |
|---|---|---|
| 2010/0171428 A1 | 7/2010 | Kirchmeier et al. |
| 2012/0074100 A1 | 3/2012 | Yamazawa |

(Continued)

FOREIGN PATENT DOCUMENTS

| | | |
|---|---|---|
| EP | 1637624 B1 | 5/2012 |
| JP | 201832853 A | 3/2018 |

(Continued)

OTHER PUBLICATIONS

PCT/US2020/029877, International Search Report and Written Opinion of the International Searching Authority.

*Primary Examiner* — Roberts P Culbert
(74) *Attorney, Agent, or Firm* — Penilla IP, APC

(57) ABSTRACT

A direct drive system for providing RF power to a substrate processing system includes a direct drive enclosure including a first direct drive circuit located in the direct drive enclosure and operating at a first frequency and a first connector connected to the first direct drive circuit. A junction box is arranged adjacent to the direct drive enclosure and includes a first capacitive circuit connected to the first direct drive circuit; a second connector located on one side of the junction box, connected to one terminal of the first capacitive circuit and mating with the first connector of the direct drive enclosure; third and fourth connectors connected to another terminal of the first capacitive circuit; and a coil enclosure arranged adjacent to the junction box and including first and second coils and fifth and sixth connectors mating with the third and fourth connectors of the junction box.

11 Claims, 7 Drawing Sheets

(56) References Cited

U.S. PATENT DOCUMENTS

2012/0247678 A1  10/2012  Takahashi et al.
2018/0047543 A1   2/2018  Setton et al.
2019/0385821 A1* 12/2019  Long .................... H03K 5/135

FOREIGN PATENT DOCUMENTS

| JP | 2018520457 A | 7/2018 |
| WO | 2014204598 A1 | 12/2014 |
| WO | 2016177766 A1 | 11/2016 |

* cited by examiner

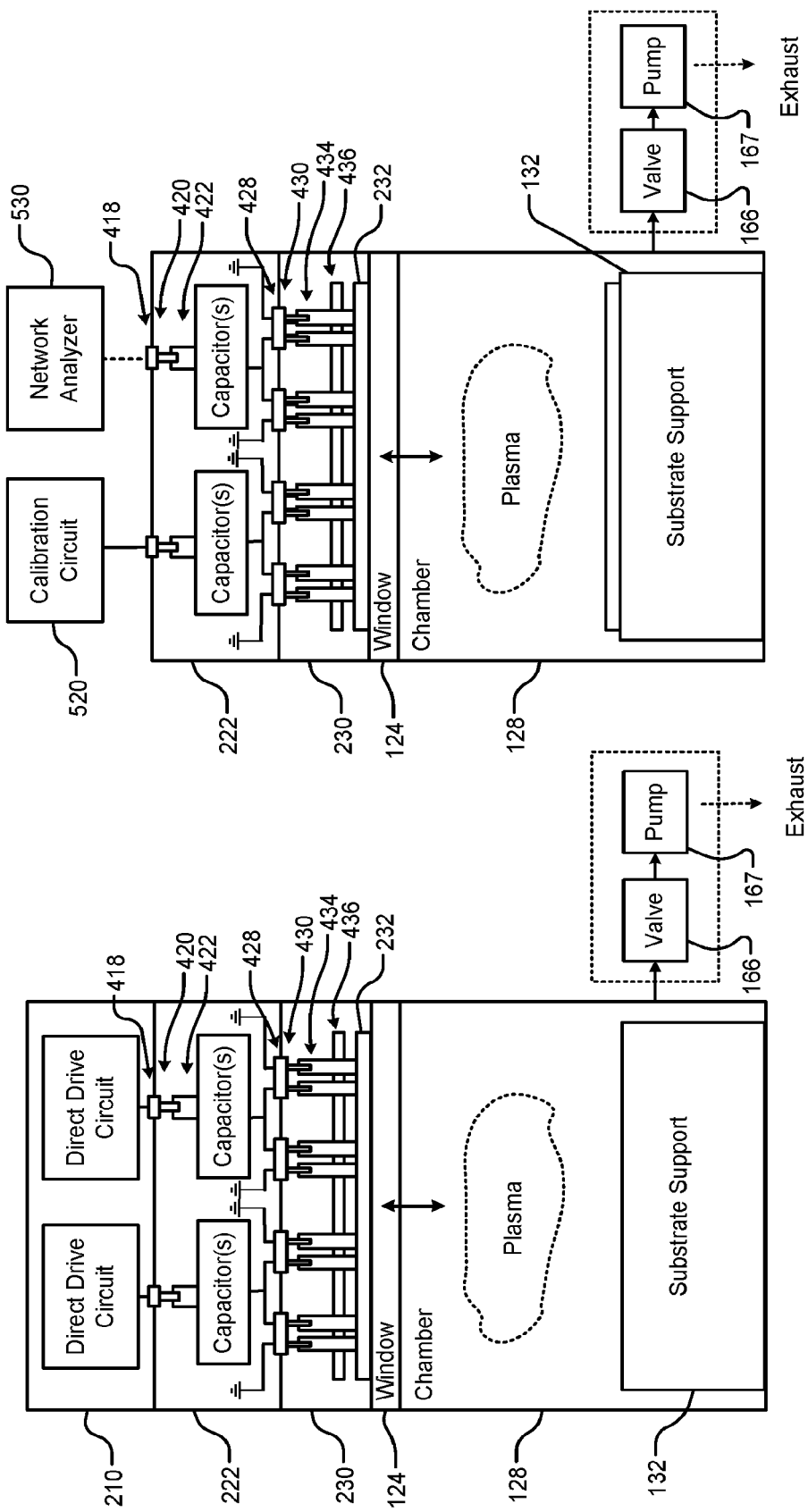

DUAL-FREQUENCY, DIRECT-DRIVE INDUCTIVELY COUPLED PLASMA SOURCE

CROSS-REFERENCE TO RELATED APPLICATIONS

This application is a national stage filing of and claims priority, under 35 U.S.C. § 371, to PCT/US2020/029877, filed on Apr. 24, 2020, which claims the benefit of U.S. Provisional Application No. 62/840,554, filed on Apr. 30, 2019. The entire disclosure of each application referenced above is incorporated herein by reference.

FIELD

The present disclosure relates to substrate processing systems, and more particularly to a dual-frequency, direct-drive inductively coupled plasma (ICP) source for a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are typically used to etch thin film on substrates such as semiconductor wafers. Etching usually includes either wet chemical etching or dry etching. Dry etching may be performed using plasma generated by inductively-coupled plasma (ICP) or capacitively coupled plasma (CCP). The ICP may be generated by an RF drive system and coils arranged outside of a processing chamber adjacent to a dielectric window. Process gas flowing inside the processing chamber is ignited to create plasma. Traditionally, the RF drive system should have an output impedance matching that of the coils and the processing chamber. When an impedance mismatch occurs, power is reflected, which is inefficient and may cause other problems.

SUMMARY

A method for providing RF power to a plasma processing system includes providing a junction box including a first connector configured to connect to a first direct drive circuit; a plurality of second connectors configured to connect to a coil enclosure; and a first capacitive circuit connected between the first connector and the plurality of second connectors. The method includes providing a coil enclosure including a plurality of third connectors connected to the plurality of second connectors of the junction box; and first and second coils connected to the plurality of third connectors of the coil enclosure. The method includes arranging the junction box and the coil enclosure adjacent to a window of a processing chamber. The method includes calibrating a capacitance value of the first capacitive circuit.

In other features, the calibrating is performed without striking plasma in the processing chamber. The calibrating is performed at atmospheric pressure. The calibrating is performed to provide series resonance at a first frequency of the first direct drive circuit.

In other features, the method includes, after calibrating the capacitance value of the first capacitive circuit, arranging a direct drive enclosure including the first direct drive circuit adjacent to the junction box.

In other features, the junction box further includes a fourth connector configured to connect to a second direct drive circuit; a plurality of fifth connectors configured to connect to the coil enclosure; and a second capacitive circuit connected between the fourth connector and the plurality of fifth connectors.

In other features, the coil enclosure includes a plurality of sixth connectors connected to the plurality of fifth connectors of the junction box; and third and fourth coils connected to the plurality of sixth connectors of the coil enclosure.

In other features, the method includes calibrating a capacitance value of the second capacitive circuit. The plurality of third connectors of the coil enclosure allow movement relative to the plurality of second connectors of the junction box.

In other features, the first and second coils are interwound in opposite directions; the third and fourth coils are interwound in opposite directions; and the first and second coils are arranged one of inside or outside of the third and fourth coils.

In other features, the first direct drive circuit includes a clock generator generating a clock signal at the first frequency a gate driver connected to an output of the clock generator; a DC supply; and a half bridge connected to the gate driver and the DC supply.

A direct drive system for providing RF power to a substrate processing system includes a direct drive enclosure including a first direct drive circuit located in the direct drive enclosure and operating at a first frequency and a first connector connected to the first direct drive circuit. A junction box is arranged adjacent to the direct drive enclosure and includes a first capacitive circuit connected to the first direct drive circuit; a second connector located on one side of the junction box, connected to one terminal of the first capacitive circuit and mating with the first connector of the direct drive enclosure; third and fourth connectors connected to another terminal of the first capacitive circuit; and a coil enclosure arranged adjacent to the junction box and including first and second coils and fifth and sixth connectors mating with the third and fourth connectors of the junction box.

In other features, the fifth and sixth connectors of the coil enclosure and the third and fourth connectors of the junction box allow movement of the first and second coils. The first direct drive circuit includes a clock generator generating a clock signal at the first frequency; a gate driver connected to an output of the clock generator; a DC supply; and a half bridge connected to the gate driver and the DC supply.

In other features, the first and second coils are interwound in opposite directions.

In other features, the direct drive enclosure further includes a second direct drive circuit located in the direct drive enclosure and operating at a second frequency; and a seventh connector connected to the second direct drive circuit.

In other features, the junction box further includes a second capacitive circuit connected to the second direct drive circuit; a eighth connector located on one side of the junction box, connected to one terminal of the second capacitive circuit and mating with the seventh connector of the direct drive enclosure; and ninth and tenth connectors connected to another terminal of the second capacitive circuit.

In other features, the coil enclosure further includes third and fourth coils; and eleventh and twelfth connectors mating with the ninth and tenth connectors of the junction box.

In other features, the first and second coils are interwound in opposite directions. The third and fourth coils are interwound in opposite directions. The first and second coils are arranged one of inside or outside of the third and fourth coils.

In other features, first terminals of the first and second coils are connected to the first capacitive circuit. First terminals of the third and fourth coils are connected to the second capacitive circuit. Second terminals of the first, second, third, and fourth coils are connected to a reference potential.

In other features, first terminals of the first, second, third, and fourth coils are respectively connected to the fifth, sixth, eleventh, and twelfth connectors of the coil enclosure. The coil enclosure further includes thirteenth, fourteenth, fifteenth, and sixteenth connectors that are respectively connected to second terminals of the first, second, third, and fourth coils. The junction box further includes seventeenth, eighteenth, nineteenth, and twentieth connectors that are connected to a reference potential and that respectively mate with the thirteenth, fourteenth, fifteenth, and sixteenth connectors of the coil enclosure.

In other features, the junction box further includes a third capacitive circuit. First terminals of the first and second coils are connected to the first capacitive circuit. First terminals of the third and fourth coils are connected to the second capacitive circuit. Second terminals of the first and second coils are connected to a reference potential. Second terminals of the third and fourth coils are connected to the third capacitive circuit.

In other features, the junction box further includes a third capacitive circuit. First terminals of the first, second, third, and fourth coils are respectively connected to the fifth, sixth, eleventh, and twelfth connectors of the coil enclosure. The coil enclosure further includes thirteenth, fourteenth, fifteenth, and sixteenth connectors that are respectively connected to second terminals of the first, second, third, and fourth coils. The junction box further includes seventeenth and eighteenth connectors that are connected to a reference potential and further includes nineteenth and twentieth connectors that are connected to the third capacitive circuit. The seventeenth, eighteenth, nineteenth, and twentieth connectors of the junction box respectively mate with the thirteenth, fourteenth, fifteenth, and sixteenth connectors of the coil enclosure.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 is a functional block diagram of an example of the direct drive system during operation according to the present disclosure;

FIG. 5 is a functional block diagram of an example of the direct drive system during calibration according to the present disclosure;

In the drawings, reference numbers may be reused to identify similar and/or identical elements.

DETAILED DESCRIPTION

Traditionally, the RF drive system should have an output impedance matching that of the coils and the processing chamber. When an impedance mismatch occurs, power is reflected, which is inefficient and may cause other problems. Using Direct-Drive™ technology available from Lam Research Corporation, there is no need to match the impedances between the output impedance of the drive circuit and coil/chamber impedance. Additional information relating to direct drive circuits can be found in commonly-assigned "Direct Drive RF Circuit for Substrate Processing Systems", U.S. Patent Application Ser. No. 16/007,481, filed on Jun. 13, 2018, which is hereby incorporated by reference in its entirety.

Figure 1:
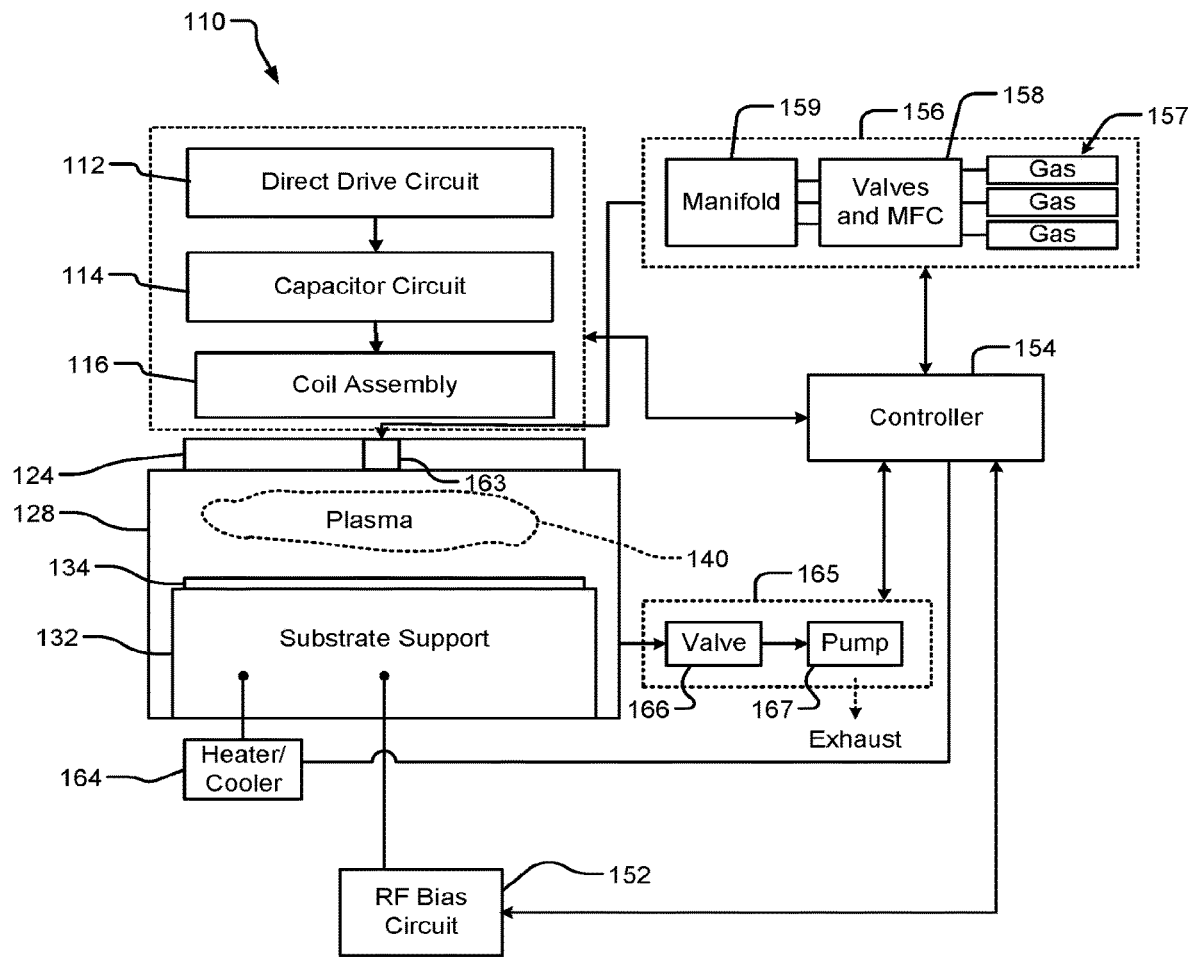
FIG. 1 is a functional block diagram of an example of a substrate processing system according the present disclosure.

Referring now to FIG. 1, an example of a substrate processing system 110 according to the present disclosure is shown. The substrate processing system 110 includes a direct drive circuit 112, a resonance capacitor circuit 114 and a coil assembly 116 including inner and outer coils and an optional frame (shown in FIGS. 4 and 6) to support the coils. In some examples, the direct drive circuit 112, the resonance capacitor circuit 114 and the coil assembly 116 are arranged in corresponding enclosures shown in FIG. 2. In some examples, the resonance capacitor circuit 114 includes one or more variable capacitors and does not include inductors. In some examples, the RF power can be pulsed on and off and/or an amplitude or level of the RF power can be varied.

A window 124 made of dielectric is arranged along one side of a processing chamber 128. The processing chamber 128 further includes a substrate support (or pedestal) 132. The substrate support 132 may include an electrostatic chuck (ESC), or a mechanical chuck or other type of chuck to support a substrate 134. Process gas is supplied to the processing chamber 128 and plasma 140 is generated inside of the processing chamber 128. The plasma 140 etches an exposed surface of the substrate 134. An RF bias circuit 152 may be used to provide an RF bias to an electrode in the substrate support 132 during operation.

A gas delivery system 156 may be used to supply a process gas mixture to the processing chamber 128. The gas delivery system 156 may include process and inert gas sources 157, a gas metering system 158 (such as valves and mass flow controllers), and a manifold 159. A heater/cooler 164 may be used to heat/cool the substrate support 132 to a predetermined temperature. An exhaust system 165 includes a valve 166 and pump 167 to remove reactants from the processing chamber 128 by purging or evacuation.

A controller 154 may be used to control the etching process. The controller 154 monitors system parameters and controls delivery of the gas mixture, striking, maintaining and extinguishing the plasma, removal of reactants, supply of cooling gas, and so on.

Figure 2:
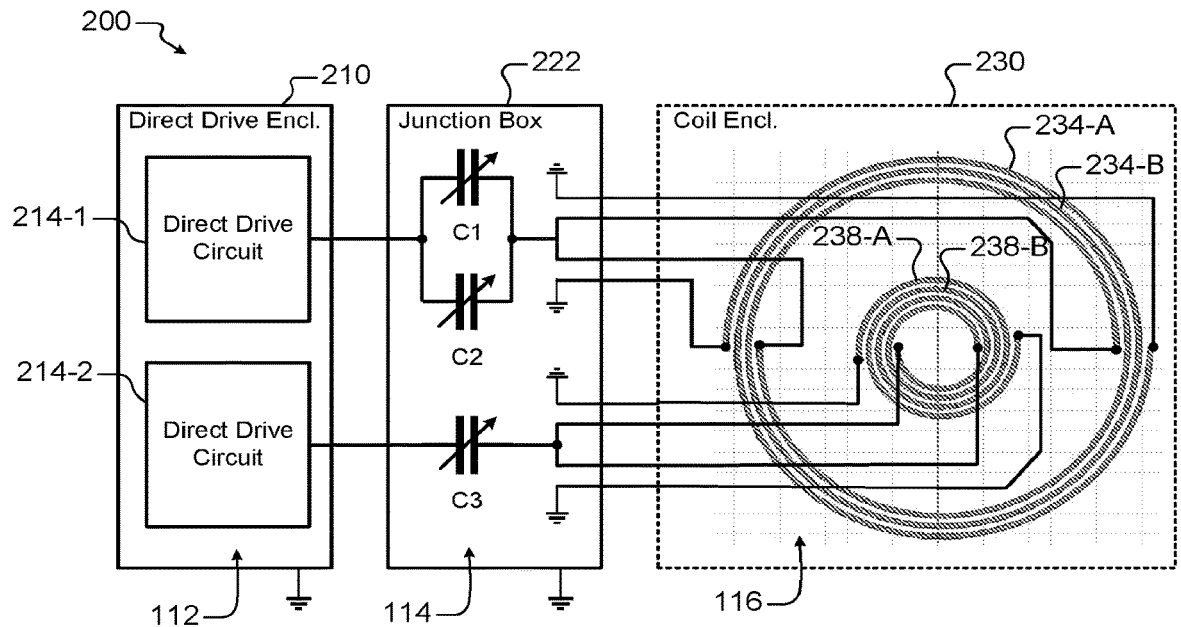
FIG. 2 is a functional block diagram and electrical schematic of an example of a direct drive system for generating ICP according to the present disclosure.

Referring now to FIG. 2, a direct drive system 200 is shown. The direct drive circuit 112 can be arranged in a direct drive enclosure 210. The capacitor circuit 114 may be arranged in a junction box 222. The coil assembly 116 may be arranged in a coil enclosure 230.

The direct drive enclosure 210 houses one or more direct drive circuits 112. For example, the direct drive enclosure 210 houses a first direct drive circuit 214-1 operating at a first frequency and a second direct drive circuit 214-2 operating at a second frequency (collectively referred to as direct drive circuits 214). In some examples, the first and second frequencies of the first and second direct drive circuits 214-1 and 214-2 are different frequencies. In some examples, the first frequency and the second frequency are in a range from 0.2 MHz to 20 MHz. In some examples, the first frequency is in a range from 1 to 6 MHz and the second frequency is in a range from 7 MHz to 20 MHz. In some examples, the first frequency is in a range from 2 to 4 MHz and the second frequency is in a range from 11-15 MHz. In some examples, the first frequency is 2 MHz and the second frequency is 13.56 MHz.

The first direct drive circuit 214-1 outputs a first RF signal to first terminals of first and second capacitors C1 and C2 of the capacitor circuit 114 that are located in the junction box 222 and are connected in parallel. Second terminals of the first and second capacitors C1 and C2 are connected to first terminals of outer coils 234-A and 234-B, respectively (collectively outer coils 234) of the coil assembly 116. The first and second capacitors C1 and C2 of the capacitor circuit 114 may be called a first capacitive circuit. In some examples, the coil assembly 116 further includes a frame (shown below in FIGS. 4 and 6) to support the coils 234 and 238. Second terminals of the outer coils 234-A and 234-B of the coil assembly 116 are connected to ground. In some examples, the first terminals are located at a radially inner end of the outer coils 234, the second terminals are located at a radially outer end of the outer coils 234, and the coils are interwound in opposite directions.

The second direct drive circuit 214-2 outputs a second RF signal to a first terminal of third capacitor C3 of the capacitor circuit 114 in the junction box 222. A second terminal of the third capacitor C3 is connected to first terminals of inner coils 238-A and 238-B of the coil assembly 116. Second terminals of the inner coils 238-A and 238-B are connected to ground. The third capacitor C3 of the capacitor circuit 114 may be called a second capacitive circuit. The outer coils 234 and the inner coils 238 may be arranged in the coil enclosure 230. In some examples, the first terminals are located at a radially inner end of the inner coils 238, the second terminals are located at a radially outer end of the inner coils 238, and the coils are interwound in opposite directions.

Figure 3:
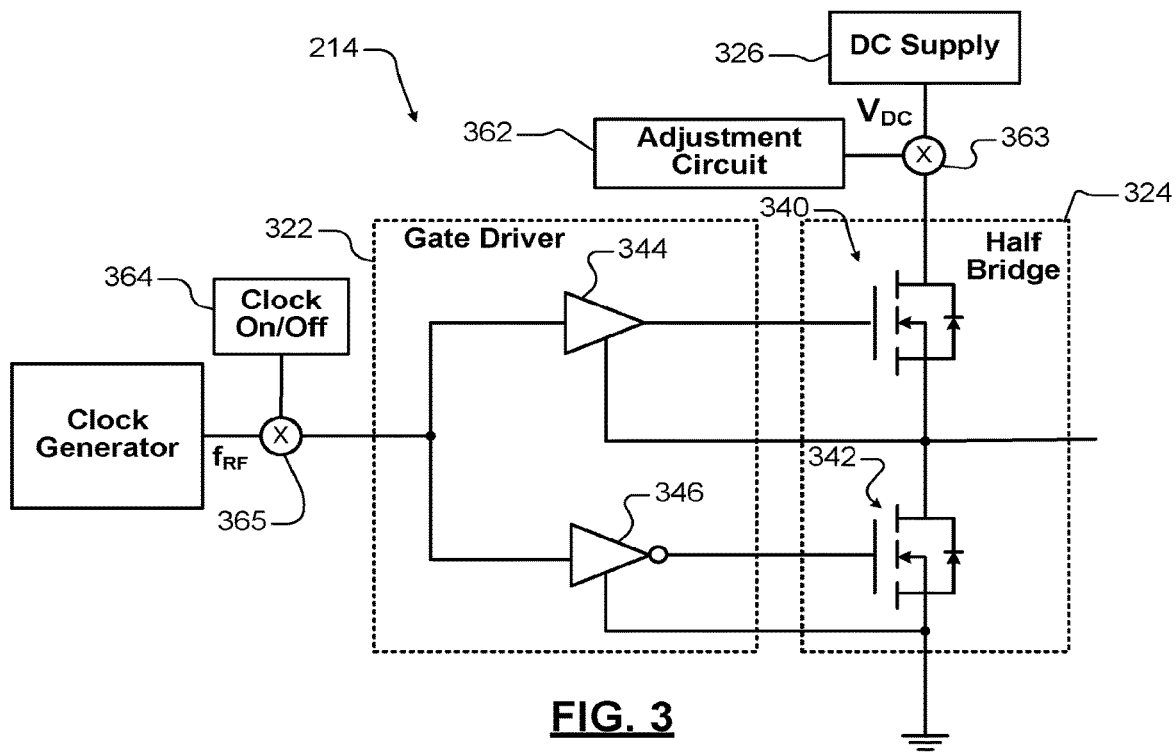
FIG. 3 is a functional block diagram and electrical schematic of an example of a direct drive circuit in the direct drive system according to the present disclosure.

Referring now to FIG. 3, an example of the direct drive circuit 214 is shown. While a specific example of a direct drive circuit is shown, other types of direct drive circuits may be used. The direct drive circuit 214 includes a clock generator 310 that outputs a clock signal at an RF frequency fRF (e.g. the first frequency or the second frequency). An output of the clock generator 310 is input to a gate driver 322. Outputs of the gate driver 332 are input to switches of a half bridge 324. In some examples, the gate driver 322 includes an amplifier 344 and an inverting amplifier 346. An output of the gate driver 322 is input to control terminal of a first switch 340 of the half bridge 324. An output of the inverting amplifier 346 is input to a control terminal of a second switch 342 of the half bridge 324.

A first terminal of the first switch 340 is connected to a DC supply 326. A second terminal of the first switch 340 is connected to a first terminal of the second switch 342. A second terminal of the second switch 342 is connected to ground. In some examples, a clock on/off circuit 364 supplies an on/off signal to one input of a multiplier 365. Another input of the multiplier 365 receives an output of the clock generator 310. The clock on/off circuit 364 and the multiplier 365 can be used to enable or disable output from the clock generator 310.

In some examples, an adjustment circuit 362 generates an on/off signal or a variable signal to one input of a multiplier 363. Another input of the multiplier 363 receives an output of the DC supply 326. The adjustment circuit 362 and the multiplier 363 selectively vary an amplitude output by the DC supply 326. In some examples, the clock on/off circuit 364 and the adjustment circuit 362 can be used for pulsing of the plasma or level-to-level shifting.

Referring now to FIG. 4, the direct drive enclosure 210 is arranged adjacent to and in contact with the junction box 222. The junction box 222 is arranged adjacent to and in contact with the coil enclosure 230. The window 124 is arranged between the coil enclosure 230 and the processing chamber 128.

Mating connectors 418 are used to releasably connect the first and second direct drive circuits 214-1, 214-2 of the direct drive enclosure 210 to the capacitors C1 and C2 and C3, respectively, of the junction box 222. In some examples, the mating connectors 418 include a female connector 420 and a male connector 422. In some examples, the male connector 422 includes a center conductor or shaft surrounded by and extending from an insulating base portion. In some examples, the female connector 420 includes a center conducting cavity surrounded by an insulating base portion. In some examples, the male connector 422 can move vertically relative to the female connector 420 while maintaining an electrical connection there between.

Likewise, mating connectors 428 are used to connect the capacitors C1 and C2 to the outer coils 234 and the capacitor C3 to the inner coils 238. In some examples, the mating connectors 428 include a male connector 430 and a female connector 434. In some examples, the male connector 430 includes a center conductor or shaft surrounded by and extending from an insulating outer portion. In some examples, the female connector 434 includes a center conducting cavity surrounded by an insulating outer portion. In some examples, the male connector 430 can move relative to the female connector 434 while maintaining an electrical connection there between. A frame 436 may be used to support and maintain relative positions of the outer coils 234 and the inner coils 238. The frame 436 may include access holes through which the female connectors 434 connect to the outer coils 234 and the inner coils 238.

When the substrate processing chamber 128 is operated at vacuum, the window 124 may flex inwardly. When pressure in the processing chamber returns to atmospheric pressure, the window 124 returns to a nominal position. The mating connectors 418 and 428 compensate for movement of the outer coils 234 and the inner coils 238 resting on the window 124 to maintain their position relative to the window 124, which reduces impedance variations.

Referring now to FIG. 5, the direct drive system is shown during calibration. Before connecting the direct drive enclosure 210 (with the direct drive circuits 214) to the junction box 222, calibration is performed. The junction box 222 is calibrated so that the outer coils 234 and the inner coils 238 are in series resonance with their corresponding capacitor(s) located in the junction box 222. In some examples, calibration is performed for each of the inputs to the junction box 222 at corresponding nominal center operating frequencies, respectively (for example only, at 2 MHz or 13.56 MHZ). In some examples, the calibration is performed in an unloaded condition (corresponding to a process chamber at atmospheric pressure with no plasma). The calibration eliminates variabilities caused by design tolerances so that an identical load is presented to the dual frequency direct drive system from one processing chamber to another processing chamber.

In some examples, a calibration circuit 520 is connected to one input of the junction box 222 and a network analyzer 530 is connected to the other input of the junction box 222. The calibration circuit 520 generates a test signal and the network analyzer 520 measures the response. If the adjusting mechanism for the capacitors includes a motor, the process can be repeated using feedback from the network analyzer 520. The process can be repeated for the other input of the junction box 222 by switching positions of the calibration circuit 520 and the network analyzer 520.

Figure 6:
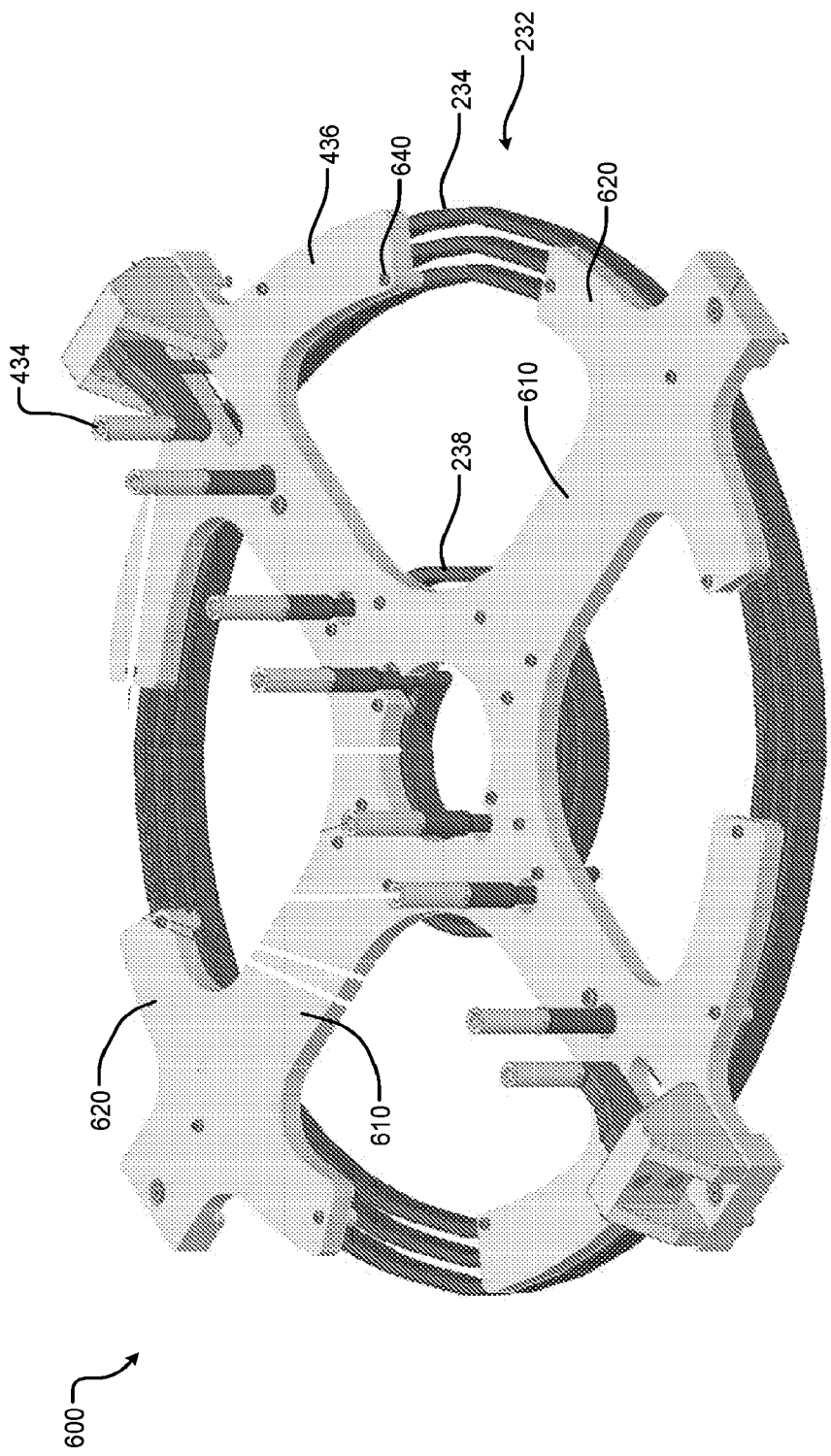
FIG. 6 is a perspective view of an example of a coil assembly, female connectors and a frame according to the present disclosure.

Referring now to FIG. 6, a coil assembly 600 is shown. The coil assembly 600 includes the outer coils 234 and the inner coils 238, the frame 436 and the female connectors 434. In some examples, the frame 436 has an "X" shape with arms 610 arranged at 90° intervals and with arcuate portions 620 extending circumferentially in both directions near ends of the arms 610. Fasteners 640 such as screws or rivets may be used to connect the frame 436 directly to the outer coils 234 and the inner coils 238. In some examples, the frame 436 is made of an insulating material.

Figure 7:
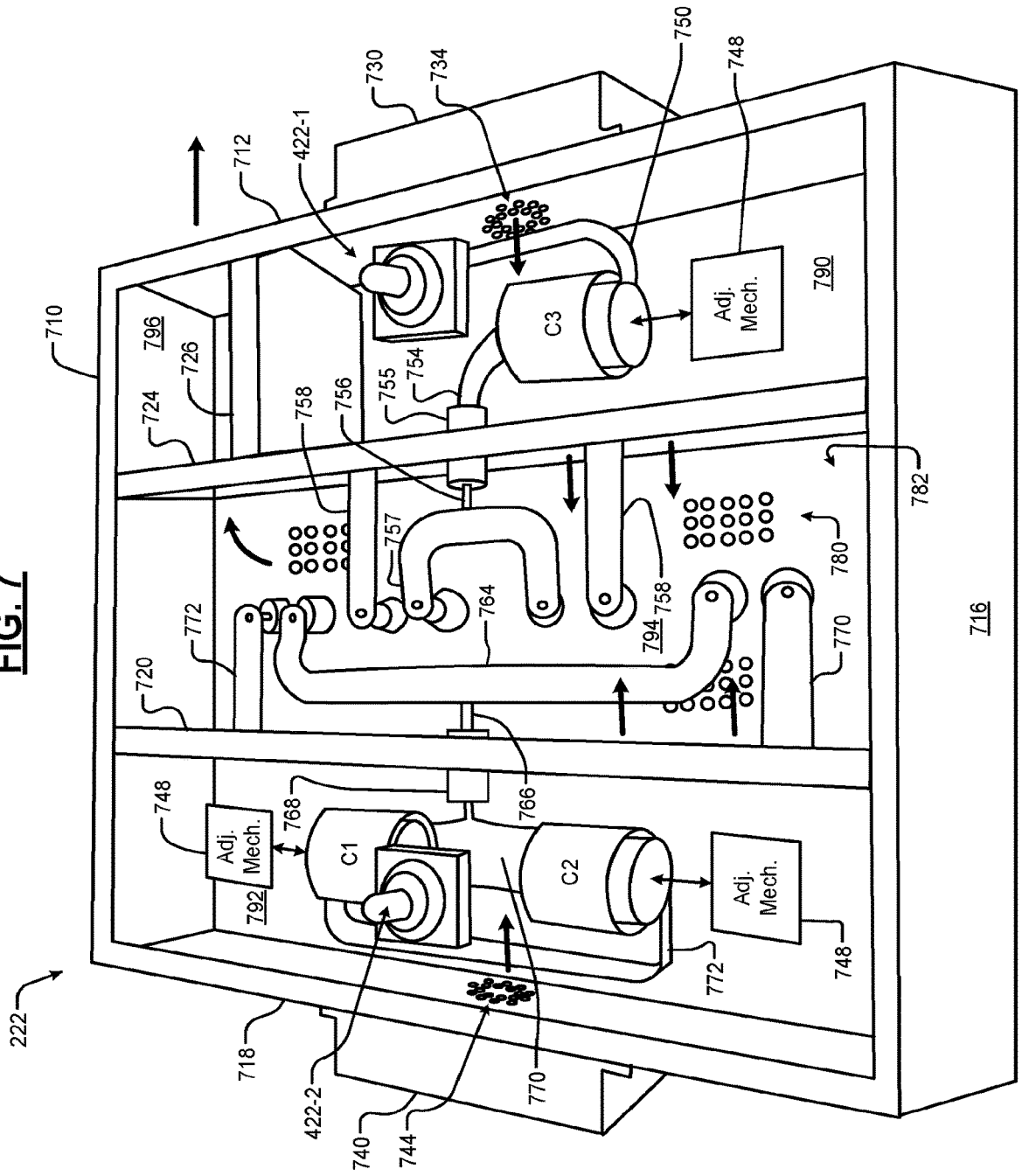
FIG. 7 is a perspective view of an example of a junction box connecting the direct drive circuits to the coil assembly according to the present disclosure.

Referring now to FIG. 7, the junction box 222 connects the direct drive circuits 214 in the direct drive enclosure 210 to the outer coils 234 and the inner coils 238. The junction box 222 includes side walls 710, 712, 716 and 718. Interior walls 722 and 724 are arranged between the side walls 710 and 716. An interior wall 726 is arranged between the interior wall 724 and the side wall 712. Capacitors C1 and C2 are arranged between side walls 710, 716, 718 and interior wall 720. Capacitor C3 is arranged between side walls 710, 712, 716 and interior walls 724 and 726.

A fan assembly 730 is arranged adjacent to the side wall 712 to supply air flow into the junction box 222 through holes 734 in the side wall 712. A fan assembly 740 is also arranged adjacent to the side wall 718 to supply air flow into the junction box 222 through holes 744 in the side wall 718. A first one of the male connectors 422-1 is connected by a strap 752 to one plate of the capacitor C3. A second plate of the capacitor C3 is connected by a strap 754 to a conductor 756 (surrounded by an insulator 755). The conductor 756 is connected to a strap 757, which is connected to two of the male connectors 430. One or more holes 780 may be provided to allow air flow through a bottom surface 782 of the junction box 222.

A strap 758 connects one of the male connectors 430 to the junction box 222. A strap 764 is connected to two of the male connectors 430. Straps 770 and 772 connect two of the male connectors 430 to the junction box 222. The strap 764 is connected by a conductor 766 (through an insulator 768) to a strap 770. The strap 770 is connected to first plates of the capacitors C1 and C2. Second plates of the capacitors C1 and C2 are connected by a strap 772 to a second one of the male connectors 422-2.

In some examples, the capacitors C1, C2 and C3 are variable capacitors that include an adjustment mechanism that changes a relationship between the plates of the capacitors C1, C2 and C3. In some examples, the capacitors C1, C2 and C3 include first and second metal cylinders that have different diameters and that are arranged concentrically. Capacitance values of the capacitors C1, C2 and C3 are defined by the amount of overlap of the first and second metal cylinders. In some examples, an adjusting mechanism 748 includes a threaded screw, a motor or other mechanism that moves the first metal cylinder axially relative to the second metal cylinder (or vice versa) to vary the amount of overlap.

The fan assemblies 730 and 740 drive air flow into side compartments 790 and 792 of the junction box 222 and then into the center compartment 794 of the junction box 222. Air exits through the holes 780 in the bottom surface 782 and/or through an exhaust path 796.

Figure 8:
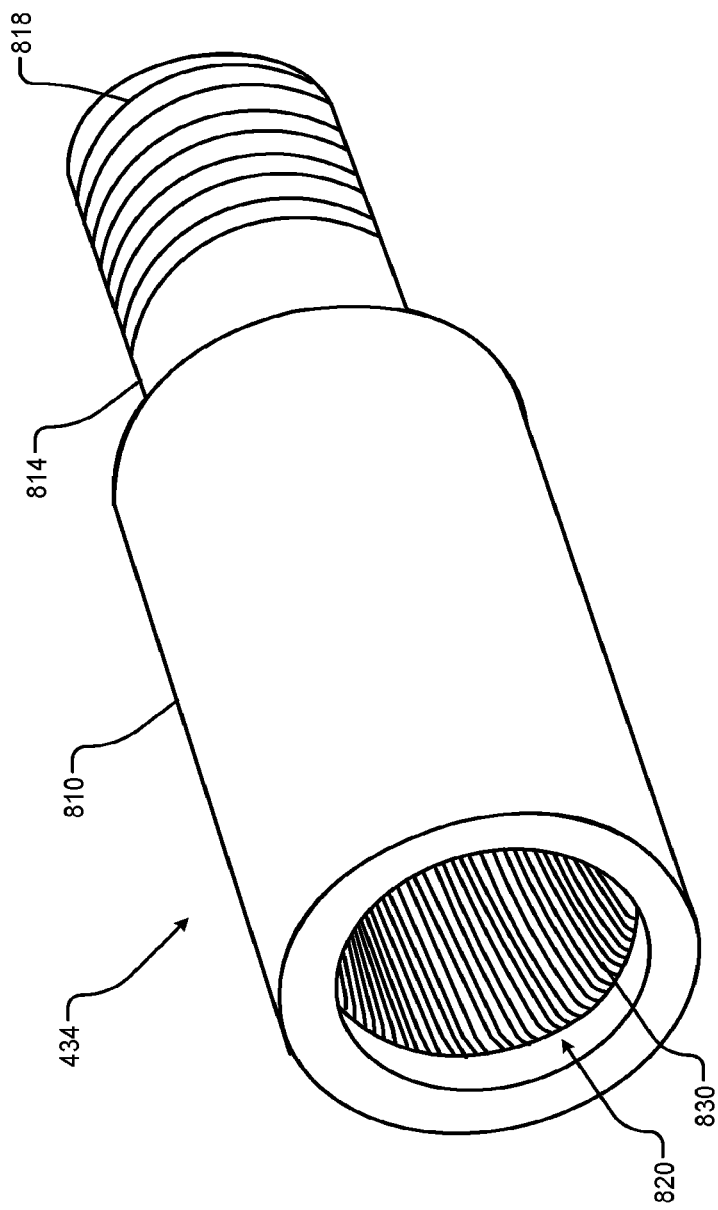
FIG. 8 is a perspective view of an example of a female connector allowing relative movement between a male connector and the female connector according to the present disclosure.

Referring now to FIG. 8, the female connector 434 allows relative movement between the male connector 430 and the female connector 434. In some examples, the female connector 434 includes a body 810. A shaft 814 extends from the body 810 and includes a threaded outer surface 818. A shaft of the male connector 430 is inserted into a cavity 820 defined by the body 810 of the female connector 434. Inner surfaces of the cavity 820 define a spring-like surface 830 that engages an outer surface of the shaft of the male connector 430 while allowing movement between the male connector 430 and the female connector 434 and while maintaining an electrical connection there between.

Figure 9:
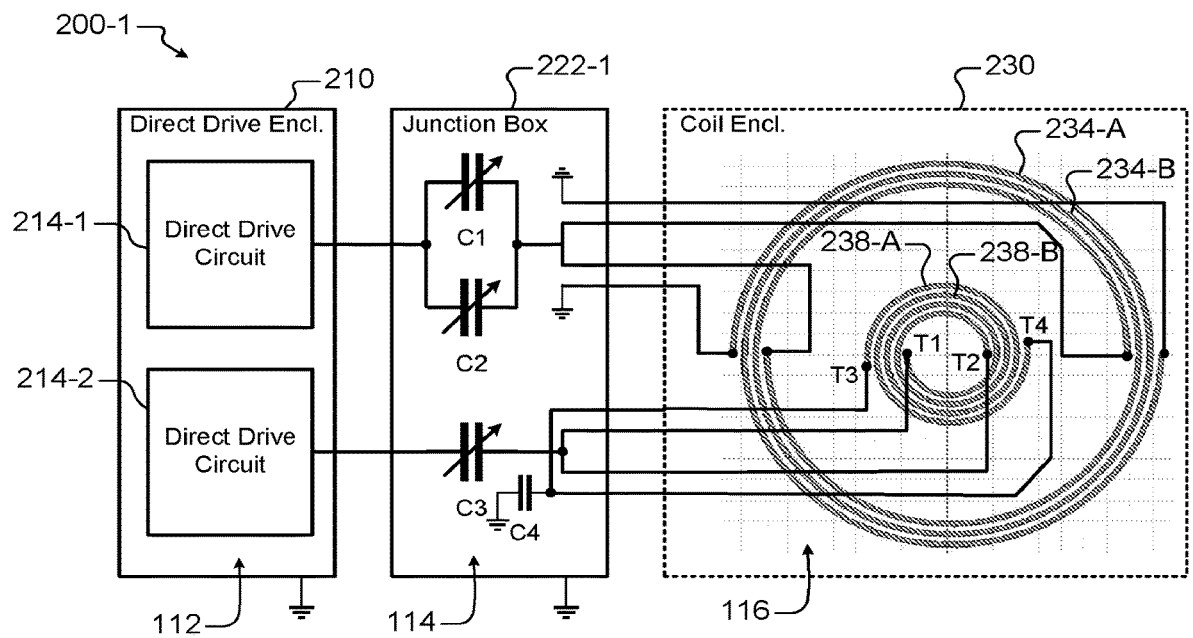
FIG. 9 is a functional block diagram and electrical schematic of an example of a direct drive system for generating ICP according to the present disclosure.

Referring now to FIG. 9, a direct drive system 200-1 comprising a junction box 222-1 is shown. The junction box 222-1 of the direct drive system 200-1 differs from the junction box 222 of the direct drive system 200 shown and described above with reference to FIG. 2 in that the second terminals of the inner coils 238-A and 238-B (identified as T3 and T4) are not connected to ground but are connected to a fourth capacitor C4 as shown. The fourth capacitor C4 may be called a third capacitive circuit.

For example, the fourth capacitor C4 may be a fixed vacuum capacitor C4 (e.g., 400 pF). As compared to the configuration shown in FIG. 2 that does not include the fourth capacitor C4, the RF voltages on the first terminals of the inner coils 238-A and 238-B (identified as T1 and T2) are reduced by about half for the same RF current in the inner coils 238-A and 238-B. At the same time, the fourth capacitor C4 also increases the RF voltages on terminals T3 and T4 to about the same as that on the terminals T1 and T2 but with opposite polarity. In contrast, in the configuration shown in FIG. 2, the RF voltage on the terminals T3 and T4 is zero volts since the terminals T3 and T4 are grounded. The fourth capacitor C4 reduces the maximum magnitude of the RF voltages among T1, T2, T3, and T4 so that the inner coils' terminals would not have RF voltages with magnitude that exceeds a threshold for causing sputtering on the ceramic window 124. This is advantageous since sputtering on the window 124 can generate metal contamination and particles on the substrate 134. The fourth capacitor C4 prevents sputtering on the window 124, which in turn prevents metal contamination and particles on the substrate 134.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for providing RF power to a plasma processing system, comprising:
   providing a junction box including:
      a first connector configured to connect to a first direct drive circuit;
      a plurality of second connectors configured to connect to a coil enclosure; and
      a first capacitive circuit connected between the first connector and the plurality of second connectors;
   providing a coil enclosure including:
      a plurality of third connectors connected to the plurality of second connectors of the junction box; and
      first and second coils connected to the plurality of third connectors of the coil enclosure;
   arranging the junction box and the coil enclosure adjacent to a window of a processing chamber; and
   calibrating a capacitance value of the first capacitive circuit.

2. The method of claim 1, wherein the calibrating is performed without striking plasma in the processing chamber.

3. The method of claim 1, wherein the calibrating is performed at atmospheric pressure.

4. The method of claim 1, wherein the calibrating is performed to provide series resonance at a first frequency of the first direct drive circuit.

5. The method of claim 4, further comprising, after calibrating the capacitance value of the first capacitive circuit, arranging a direct drive enclosure including the first direct drive circuit adjacent to the junction box.

6. The method of claim 1, wherein the junction box further includes:
   a fourth connector configured to connect to a second direct drive circuit;
   a plurality of fifth connectors configured to connect to the coil enclosure; and
   a second capacitive circuit connected between the fourth connector and the plurality of fifth connectors.

7. The method of claim 6, wherein the coil enclosure includes:
   a plurality of sixth connectors connected to the plurality of fifth connectors of the junction box; and
   third and fourth coils connected to the plurality of sixth connectors of the coil enclosure.

8. The method of claim 7, further comprising calibrating a capacitance value of the second capacitive circuit.

9. The method of claim 1, wherein the plurality of third connectors of the coil enclosure allow movement relative to the plurality of second connectors of the junction box.

10. The method of claim 8, wherein:
    the first and second coils are interwound in opposite directions;
    the third and fourth coils are interwound in opposite directions; and
    the first and second coils are arranged one of inside or outside of the third and fourth coils.

11. The method of claim 5, wherein the first direct drive circuit includes:
    a clock generator generating a clock signal at the first frequency;
    a gate driver connected to an output of the clock generator;
    a DC supply; and
    a half bridge connected to the gate driver and the DC supply.

* * * * *